(12) United States Patent
Hasegawa et al.

(10) Patent No.: US 6,628,573 B2
(45) Date of Patent: Sep. 30, 2003

(54) SOUND APPARATUS FOR VEHICLE

(75) Inventors: Tsutomu Hasegawa, Hiroshima-ken (JP); Akihiro Fujiwara, Hiroshima-ken (JP); Kiyoshi Mutsura, Hiroshima-ken (JP); Futoshi Shoji, Hiroshima-ken (JP)

(73) Assignee: Mazda Motor Corporation, Hiroshima (JP)

( * ) Notice: Subject to any disclaimer, the term of this patent is extended or adjusted under 35 U.S.C. 154(b) by 312 days.

(21) Appl. No.: 09/761,726

(22) Filed: Jan. 18, 2001

(65) Prior Publication Data

US 2001/0012243 A1 Aug. 9, 2001

(30) Foreign Application Priority Data

Feb. 3, 2000 (JP) ........................................ 2000-026490

(51) Int. Cl.[7] ................................................ H04B 1/20
(52) U.S. Cl. ............................. 369/6; 455/345; 701/35; 714/30
(58) Field of Search ........................... 369/6, 7, 11, 12; 701/35, 29, 31, 32; 73/117.2, 117.3; 714/30, 32, 716; 370/341, 349; 455/344, 345, 346, 575

(56) References Cited

U.S. PATENT DOCUMENTS

| | | | |
|---|---|---|---|
| 4,497,057 A | | 1/1985 | Kato et al. |
| 4,817,418 A | * | 4/1989 | Asami et al. ............... 73/118.1 |
| 4,843,557 A | * | 6/1989 | Ina et al. ..................... 701/114 |
| 5,077,712 A | * | 12/1991 | Nakamichi ..................... 369/6 |
| 5,396,618 A | | 3/1995 | Fukui et al. |
| 5,436,851 A | | 7/1995 | Shimotsuma et al. |
| 5,594,646 A | | 1/1997 | Itoh et al. |
| 5,815,468 A | * | 9/1998 | Muramatsu et al. ........... 369/2 |
| 6,147,938 A | * | 11/2000 | Ogawa et al. ................ 369/12 |

FOREIGN PATENT DOCUMENTS

| | | |
|---|---|---|
| JP | 08-124367 | 5/1996 |
| JP | 11-031087 | 2/1999 |

\* cited by examiner

Primary Examiner—Tan Dinh

(57) ABSTRACT

When some failure has been detected as a result of self diagnosis in first and second sound playback units (20, 30), a nonvolatile memory (48) in a control unit (40) stores device, product, and error codes, and a predetermined pattern for informing that failure is displayed on a panel display device (12). The stored codes can be displayed on the panel display device (12) in response to predetermined first operation, and when input operation for operating the disabled unit is made at a control panel (10), the CPU 46 re-displays the predetermined pattern for informing the failure on the display device with reference to the stored codes.

23 Claims, 15 Drawing Sheets

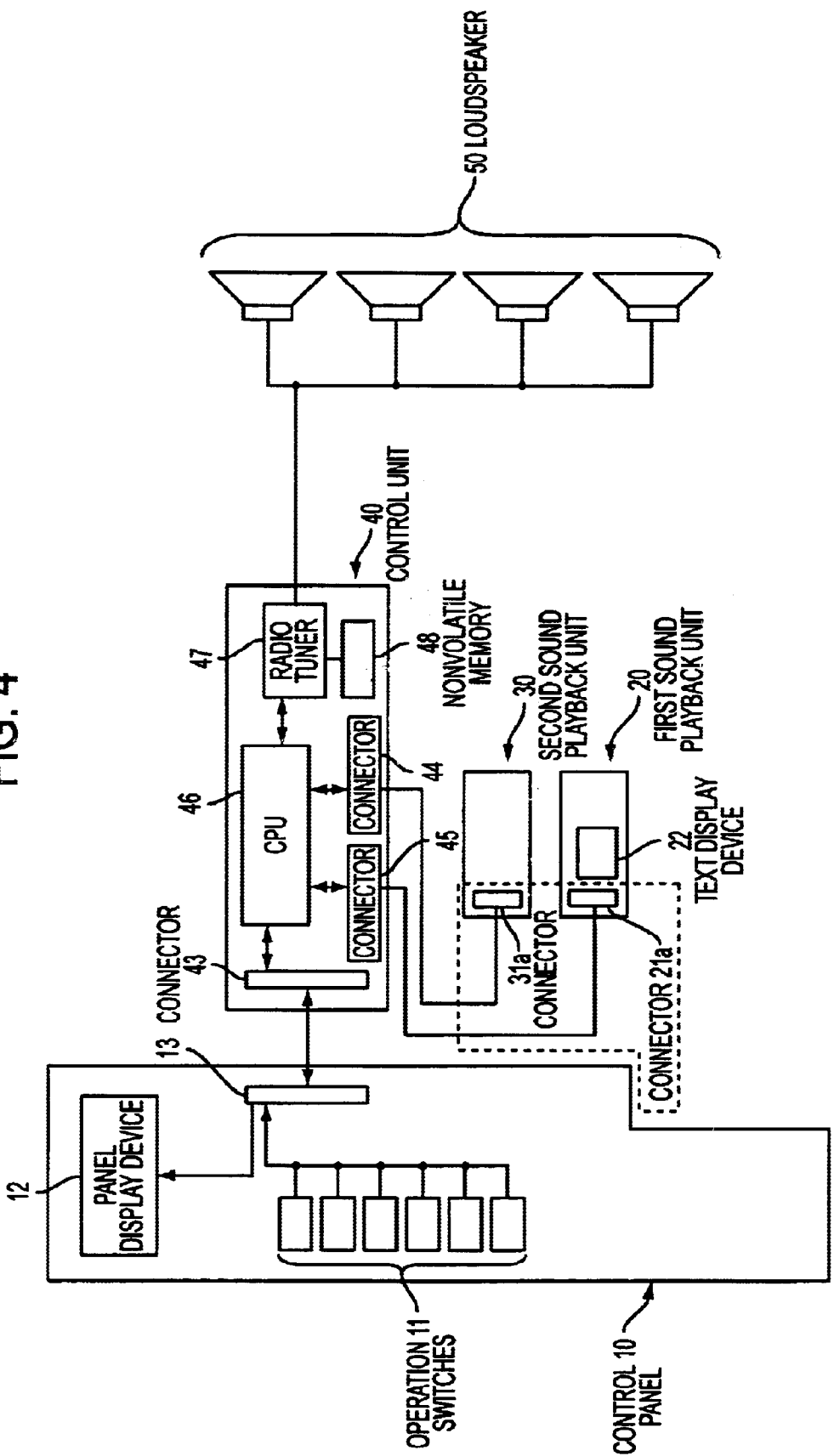

FIG. 5

SELF DIAGNOSIS FUNCTION

| FAILURE CLASS | DIAGNOSIS ITEM | FAILURE SYMPTOMS/SYSTEM ABNORMAL SYMPTOMS | FAILURE DETECTION METHOD | STORE IN EEPRM |
|---|---|---|---|---|
| CONTROL UNIT | PLL LOCK ERROR | RADIO SIGNAL CANNOT BE RECEIVED | DETECT PLL LOCK TIME OVER | YES |
| | ABNORMAL POWER SUPPLY VOLTAGE DETECTION | AUDIO DOES NOT FUNCTION | A/D CONVERT AND READ +B POWER SUPPLY VOLTAGE VALUE | YES |
| | BUS LINE ERROR | TAPE DOES NOT OPERATE | NO PRESCRIBED RESPONSE IS DETECTED FROM DESIGNATED MODULE ALTHOUGH LAST STATE INDICATES PRESENCE OF CONNECTION | YES |
| | | CD-P DOES NOT OPERATE | SAME AS ABOVE COLUMN | YES |
| | | INDASH CD-CH DOES NOT OPERATE | SAME AS ABOVE COLUMN | YES |
| | | MD-P DOES NOT OPERATE | SAME AS ABOVE COLUMN | YES |
| CD-P | MECHANISM ERROR | DISC CANNOT BE LOADED OR UNLOADED | DETECT PHENOMENON IN WHICH TARGET STATE CANNOT BE REACHED EVEN AFTER RETRIAL | YES |
| | SERVO ERROR | TRACK CHANGE IS DESABLED | DETECT PHENOMENON IN WHICH TARGET TRACK CANNOT BE ACCESSED EVEN AFTER RETRIAL | YES |
| | DISC READ ERROR | DISC CANNOT BE PLAYED BACK | DETECT PHENOMENON IN WHICH TOC CANNOT BE NORMALLY READ | YES |
| INDASH CD-C | MECHANISM ERROR | DISC CANNOT BE LOADED OR UNLOADED | DETECT PHENOMENON IN WHICH TARGET STATE CANNOT BE REACHED EVEN AFTER RETRIAL | YES |
| | SERVO ERROR | TRACK CHANGE IS DESABLED | DETECT PHENOMENON IN WHICH TARGET TRACK CANNOT BE ACCESSED EVEN AFTER RETRIAL | YES |
| | DISC READ ERROR | DISC CANNOT BE PLAYED BACK | DETECT PHENOMENON IN WHICH TOC CANNOT BE NORMALLY READ | YES |
| TAPE-P | MECHANISM ERROR | TAPE CANNOT BE LOADED OR UNLOADED | DETECT PHENOMENON IN WHICH TARGET STATE CANNOT BE REACHED EVEN AFTER RETRIAL | YES |
| | TIGHT TAPE ERROR | NO TAPE SOUND IS OUTPUT | DETECT PHENOMENON IN WHICH SUPPLY REEL & TAKEUP REEL STOP DURING PLAY | YES |
| | TAPE CUT ERROR | TAPE CUT | DETECT TAPE CUT | YES |
| MD-P | MECHANISM ERROR | DISC CANNOT BE LOADED OR UNLOADED | DETECT PHENOMENON IN WHICH TARGET STATE CANNOT BE REACHED EVEN AFTER RETRIAL | YES |
| | SERVO ERROR | TRACK CHANGE IS DESABLED | DETECT PHENOMENON IN WHICH TARGET TRACK CANNOT BE ACCESSED EVEN AFTER RETRIAL | YES |
| | DISC READ ERROR | DISC CANNOT BE PLAYED BACK | DETECT PHENOMENON IN WHICH TOC CANNOT BE NORMALLY READ | YES |
| COMMON | NO ERROR | | | NO |

FIG. 6

DIAGNOSIS ASSIST FUNCTION

| DIAGNOSIS CLASS | DIAGNOSIS ITEM | FAILURE (SYSTEM) SYMPTOMS | FAILURE DIAGNOSIS METHOD | STORE INFORMATION IN EEPROM |
|---|---|---|---|---|
| CONTROL UNIT | LCD DISPLAY | LCD DISPLAY ERROR | TURN ON ALL LCD ELEMENTS AND VISUALLY CONFIRM LCD FAILURE | NO |
| | FUNCTION SW | FUNCTION SW DOES NOT WORK | GENERATE BEEP TONE UPON OPERATION OF FUNCTION SW, AND CONFIRM SW FAILURE | NO |
| | SPEAKER CONNECTION | NO SOUND IS OUTPUT FROM SPECIFIC SPEAKER | AUTOMATICALLY GENERATE SPEAKER OUTPUT IN TURN FROM FL → FR → RR → RL → FL... TO AUDIBLY FIND SPEAKER CONNECTION ERROR POSITION | NO |
| | RADIO (INCLUDING ANTENNA SYSTEM) | RADIO CANNOT BE RECEIVED OR LOW RECEPTION SENSITIVITY | DISPLAY S-METER VOLTAGE OF TUNER AS BAR TO CONFIRM RF INPUT VOLTAGE (FIELD STRENGTH) STATE OF RATIO | NO |
| | DIVERSITY | DIVERSITY FUNCTION ERROR | FIX MAIN AND SUB ANTENNAS TO CONFIRM PERFORMANCE DIFFERENCE FROM THAT WHEN DIVERSITY FUNCTION IS AVAILABLE | NO |
| | ANTENNA-CONT | ANTENNA CONT OUTPUT DOES NOT FUNCTION (ANTENNA CANNOT BE EXTENDED) | CONFIRM ANTENNA-CONT CONTROL OUTPUT OF MICROCOMPUTER IN RADIO MODE | NO |
| | AMP-CONT | AMP CONT OUTPUT DOES NOT FUNCTION (NO SOUND IS OUTPUT) | CONFIRM AMP-CONT CONTROL OUTPUT STATE OF MICROCOMPUTER UPON POWER ON | NO |

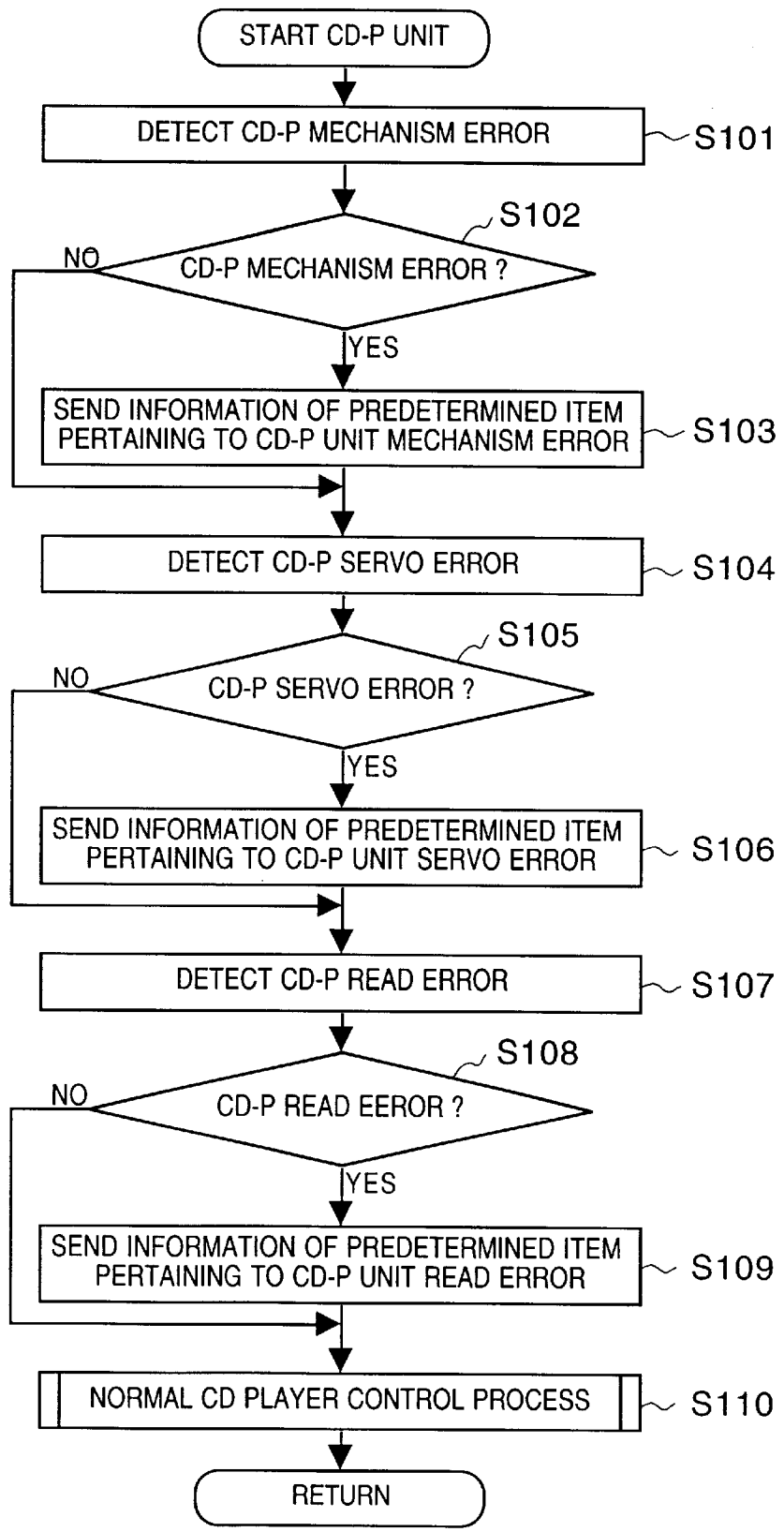

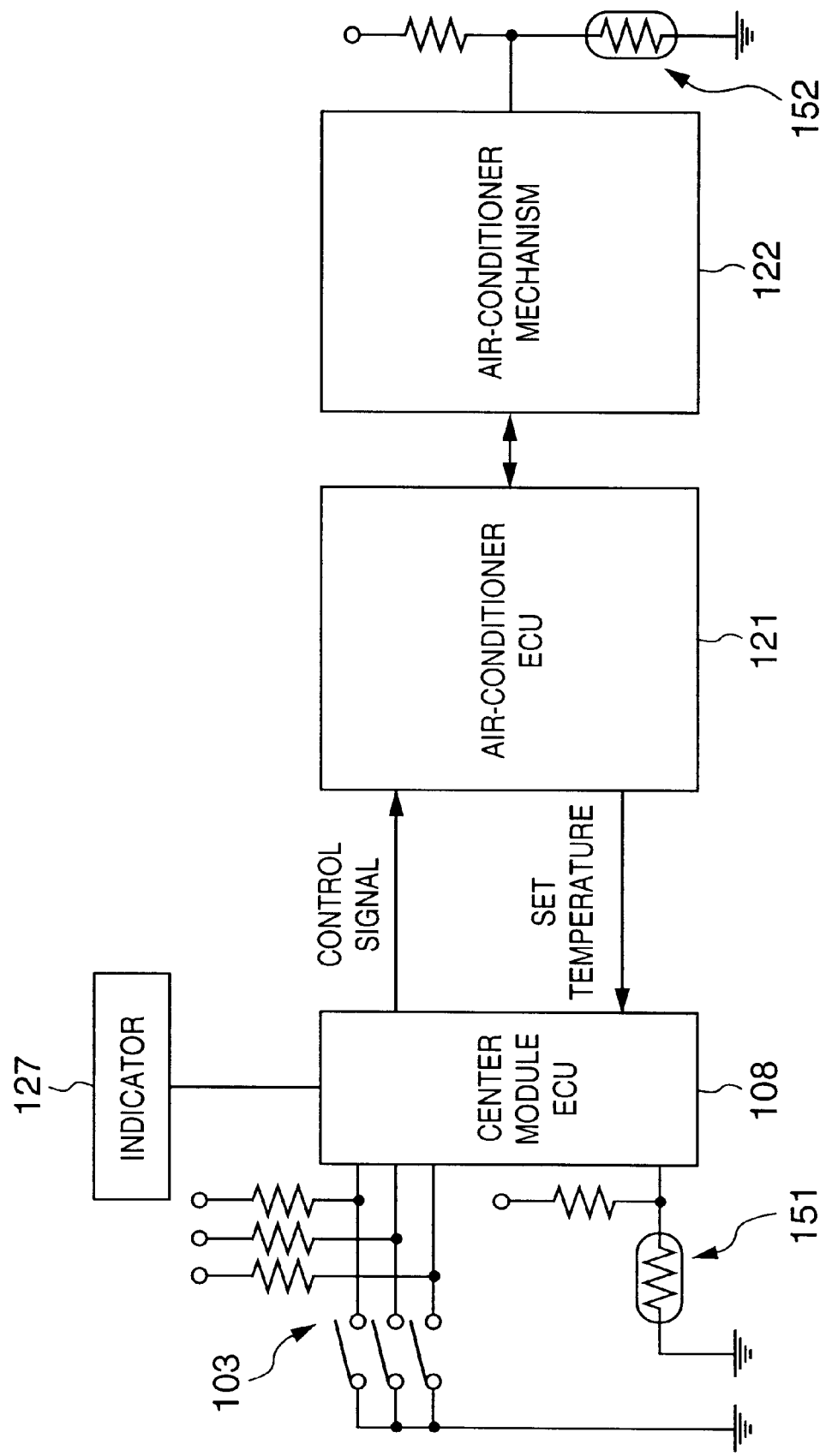

SOUND APPARATUS FOR VEHICLE

FIELD OF THE INVENTION

The present invention relates to an electronic apparatus for a vehicle and, for example, to a sound apparatus for a vehicle, which allows an operator to integrally operate players (playback devices) of a cassette tape, CD, MD, and the like at a control panel.

BACKGROUND OF THE INVENTION

Conventionally, in an automobile as a representative vehicle, various electronic apparatuses are equipped, and as an example of such sound apparatus for a vehicle, Japanese Patent Laid-Open No. 11-31087 previously filed by the present applicant discloses an electronic apparatus in which a center module for systematically controlling a plurality of electronic units such as an air-conditioner control module, car audio control module, and the like diagnoses failures of these electronic units, and displays a message upon detecting any failures.

An example of an electronic apparatus disclosed in an embodiment of the specification of the previous application for the purpose of reducing development cost required for realizing a failure diagnosis function, and improving failure diagnosis precision will be briefly explained below.

That is, in an embodiment of the previous application shown in FIG. 13 (FIG. 9 of the previous application), the detection value of a room temperature sensor 151 is input to a center module electronic control unit (ECU) 108, and the detection value of a room temperature sensor 152 is input to an air-conditioner ECU 121 via an air-conditioner mechanism 122.

The center module ECU 108 outputs the detection value detected by the room temperature sensor 151 to the air-conditioner ECU 121, and executes predetermined arithmetic processes using that detection value.

The air-conditioner ECU 121 executes the same arithmetic processes as the predetermined arithmetic processes using the detection value of the room temperature sensor 151 acquired via the center module ECU 108, and the detection value of the room temperature sensor 152 acquired via the air-conditioner mechanism 122, and sends these arithmetic process results to the center module ECU 108.

The center module ECU 108 compares arithmetic process results computed by itself and those acquired from the air-conditioner ECU 121, and determines that some failure has occurred in the air-conditioner ECU 121 or air-conditioner mechanism 122 if these results do not match.

Japanese Patent Publication No. 61-32173 and U.S. Pat. No. 4,497,057 as its corresponding U.S. application propose an abnormality display device in which a plurality of control units for controlling the behaviors of a vehicle such as anti-skid control, engine combustion control, vehicle velocity control, and the like make self diagnosis, and failure information detected by these control unit is sent to a management device which integrally stores and displays the failure information of the respective control units.

According to the former prior art, when any failure has occurred, a passenger can be alerted to it. However, since the state of the failure is not preserved, a service station such as a dealer or the like cannot quickly find the failure that has occurred on the basis of verbal information given by the customer.

By contrast, according to the latter prior art, since the internal memory of the management device integrally stores failure information, a cause of the failure can be easily found upon maintenance by reading out the information stored in the memory.

However, since the memory size is limited, if new failure information is stored in the memory as a result of failure diagnosis which is done by a service person for maintenance, the required failure information may be deleted and, hence, the apparatus cannot fully assist failure diagnosis upon maintenance.

Also, when the memory is added for the purpose of storing only failure-information, a cost reduction is disturbed.

When a given failure has occurred, information required by a service person is not always required by a passenger.

Assume that a given function has failed, and other functions are still operable. In this case, if information that pertains to the failure is always displayed, the convenience impairs. This is particularly the case when an electronic apparatus to be monitored, which does not pose any fatal failure against safe running of a vehicle, e.g., a sound apparatus such as a car stereo system or the like, has failed.

SUMMARY OF THE INVENTION

The present application pays attention to a sound apparatus which is most popular among electronic apparatuses for a vehicle and includes, e.g., a cassette tape playback device, radio receiver, and the like, and has as its object to integrally store failure information that has occurred in various sound playback units which construct the sound apparatus.

In order to achieve the above object, a sound apparatus for a vehicle according to the present invention is characterized by the following arrangement.

That is, a sound apparatus for a vehicle, which comprises a control panel (10) provided with operation switches that can operate a display device and a sound playback unit, a sound playback unit (20, 30) which is independent from the control panel and plays back sound information in a predetermined information format and a control unit (40) which is independent from the control panel, and controls operation of the sound playback unit in accordance with an operation signal input from the operation switch, is characterized in that the sound playback unit (20, 30) makes self diagnosis of predetermined items therein, and outputs the diagnosis result to the control unit via a communication line, and the control unit makes self diagnosis of predetermined items therein, and stores at least failure information of the diagnosis result thereof and the diagnosis result input from the sound playback unit in a nonvolatile memory (48) provided thereto.

Alternatively, as another sound apparatus for a vehicle that can achieve the aforementioned object, a sound apparatus for a vehicle, which comprises a control panel (10) provided with operation switches that can operate a display device and a sound playback unit on one surface facing a passenger room, a sound playback unit (20, 30) which is disposed as one component on the other surface of the control panel and plays back sound information pre-stored in a storage medium and a control unit (40) which is disposed as one component on the other surface of the control panel, has a radio tuner (47) as another sound playback unit, and controls playback operations of the radio tuner and the sound playback unit in accordance with an operation signal input from the operation switch, is characterized in that the sound playback unit makes self diagnosis of predetermined items therein, and outputs the diagnosis result to the control unit via a communication line, and the control unit makes self diagnosis of predetermined items including operation of the radio tuner therein, and stores at least failure information of the diagnosis result thereof and the diagnosis result input from the sound playback unit in a nonvolatile memory (48) provided thereto.

With both the sound apparatuses for a vehicle with the above arrangements, failure information that has occurred in each of various sound playback units which construct the sound apparatus for a vehicle can be integrally stored in the control unit which controls these sound playback units.

In a preferred embodiment, if the sound apparatus for a vehicle with either arrangement uses, as the nonvolatile memory, a nonvolatile memory for storing a password which can restrict unauthorized access to the sound apparatus for a vehicle, a cost reduction can be achieved by sharing the nonvolatile memory.

Alternatively, in the arrangement of the other sound apparatus for a vehicle, if a nonvolatile memory for storing frequency information to be received by the radio tuner is used as the nonvolatile memory, a cost reduction can be achieved by sharing the nonvolatile memory.

In either apparatus arrangement, the control unit also controls display operation of the display device, and displays failure information stored in the nonvolatile memory on the display device in accordance with a predetermined operation input at the control panel. With this arrangement, the state of failure that occurred previously can be checked quickly.

For example, the sound apparatus for a vehicle can mount as the sound playback unit an arbitrary sound playback unit selected from a plurality of different sound playback units of different manufacturers or models, and the control unit displays identification information which can specify a manufacturer or model of the sound playback unit which is selected in advance and mounted as the sound playback unit in association with the failure information when the failure information is displayed on the display device in response to the predetermined operation input at the control panel. With this arrangement, even in the sound apparatus for a vehicle that allows various system arrangements, the system arrangement of the sound apparatus which differs in units of users can be easily recognized upon checking the failure state.

For example, the sound apparatus for a vehicle can mount as the sound playback unit an arbitrary sound playback unit selected from a plurality of different sound playback units of different manufacturers or models, the sound playback unit outputs identification information that can specify a manufacturer or model of the sound playback unit together with the diagnosis result upon outputting the diagnosis result to the control unit, and the control unit stores the failure information and identification information in the nonvolatile memory, also controls display operation of the display device, and displays the failure information and identification information in association with each other in response to a predetermined operation input at the control panel. With this arrangement, even in the sound apparatus for a vehicle that allows various system arrangements, the system arrangement of the sound apparatus which differs in units of users can be easily recognized upon checking the failure state.

For example, the sound playback unit includes a plurality of sound playback units for playing back storage media of different formats, and when a failure has occurred in one of communication lines to the plurality of sound playback units as one of the predetermined self diagnosis items, the control unit stores information that can specify the communication line which has suffered the failure in the nonvolatile memory. In this case, the control unit preferably inhibits failure diagnosis of the communication lines until predetermined initial start operation thereof is completed. In this way, a sound playback unit which can normally operate even when it has failed partially can continue its playback operation.

For example, when input operation for operating the disabled sound playback unit corresponding to the failure information stored in the nonvolatile memory is made at the control panel, the control unit displays on the display device information indicating that the sound playback unit has failed. In this manner, a passenger can be alerted to the failed sound playback unit using failure information integrally stored in the nonvolatile memory. With this alarm, the failure state can be prevented from worsening by passenger's forcible operation, and the passenger can quickly select another available function without repeating wasteful operations.

For example, when operation for operating the disabled sound playback unit corresponding to the failure information stored in the nonvolatile memory is input at the control panel, the control unit inhibits operation control of that disabled sound playback unit. With this arrangement, since optimal control is done in correspondence with the failure state, deterioration of operability upon failure can be minimized.

For example, when a control signal is received from the sound playback unit, the control unit executes a predetermined process according to the control signal, and when the control signal is received from the disabled sound playback unit corresponding to the failure information stored in the nonvolatile memory, the control unit inhibits execution of the predetermined process for the disabled sound playback unit. With this arrangement, since optimal control is done in correspondence with the failure state, deterioration of operability upon failure can be minimized.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 4 is a block diagram showing the electrical control functions of the sound apparatus for a vehicle according to the embodiment of the present invention;

FIG. 5 is a table for explaining self diagnosis functions in respective units that can construct the sound apparatus for a vehicle according to the embodiment of the present invention;

FIG. 6 is a table for explaining failure diagnosis assist functions that can be executed by the sound apparatus for a vehicle according to the embodiment of the present invention;

FIG. 9 is a flow chart showing the control process of a CD player unit;

FIG. 13 is a diagram showing an embodiment disclosed in Japanese Patent Laid-Open No. 11-31087 previously filed by the present applicant.

DESCRIPTION OF THE PREFERRED EMBODIMENT

An embodiment of a sound apparatus for a vehicle according to the present invention will be described in detail hereinafter with reference to the accompanying drawings.

<Apparatus Arrangement>

Figure 1:
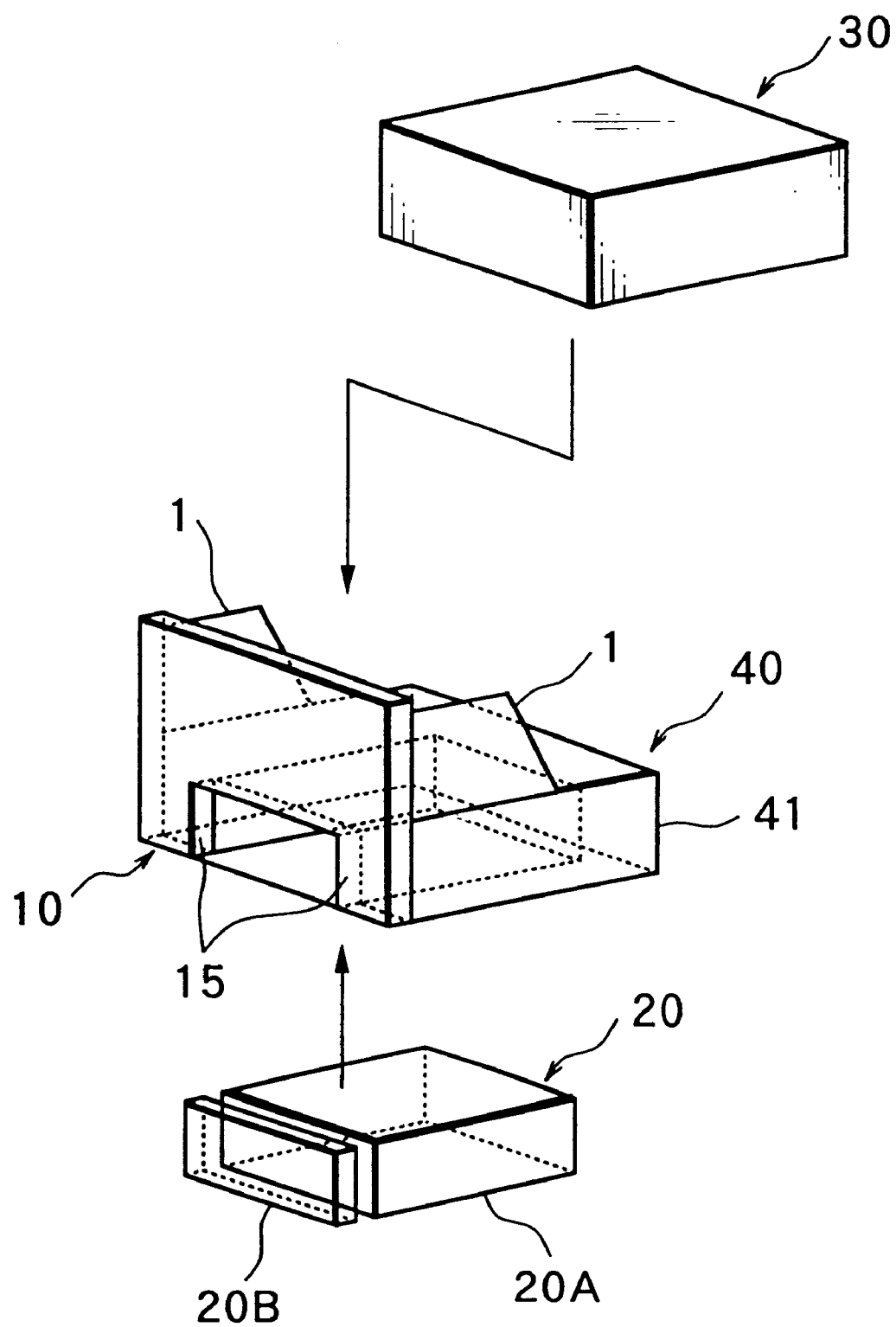
FIG. 1 is an exploded view of a sound apparatus for a vehicle according to an embodiment of the present invention.
Figure 2:
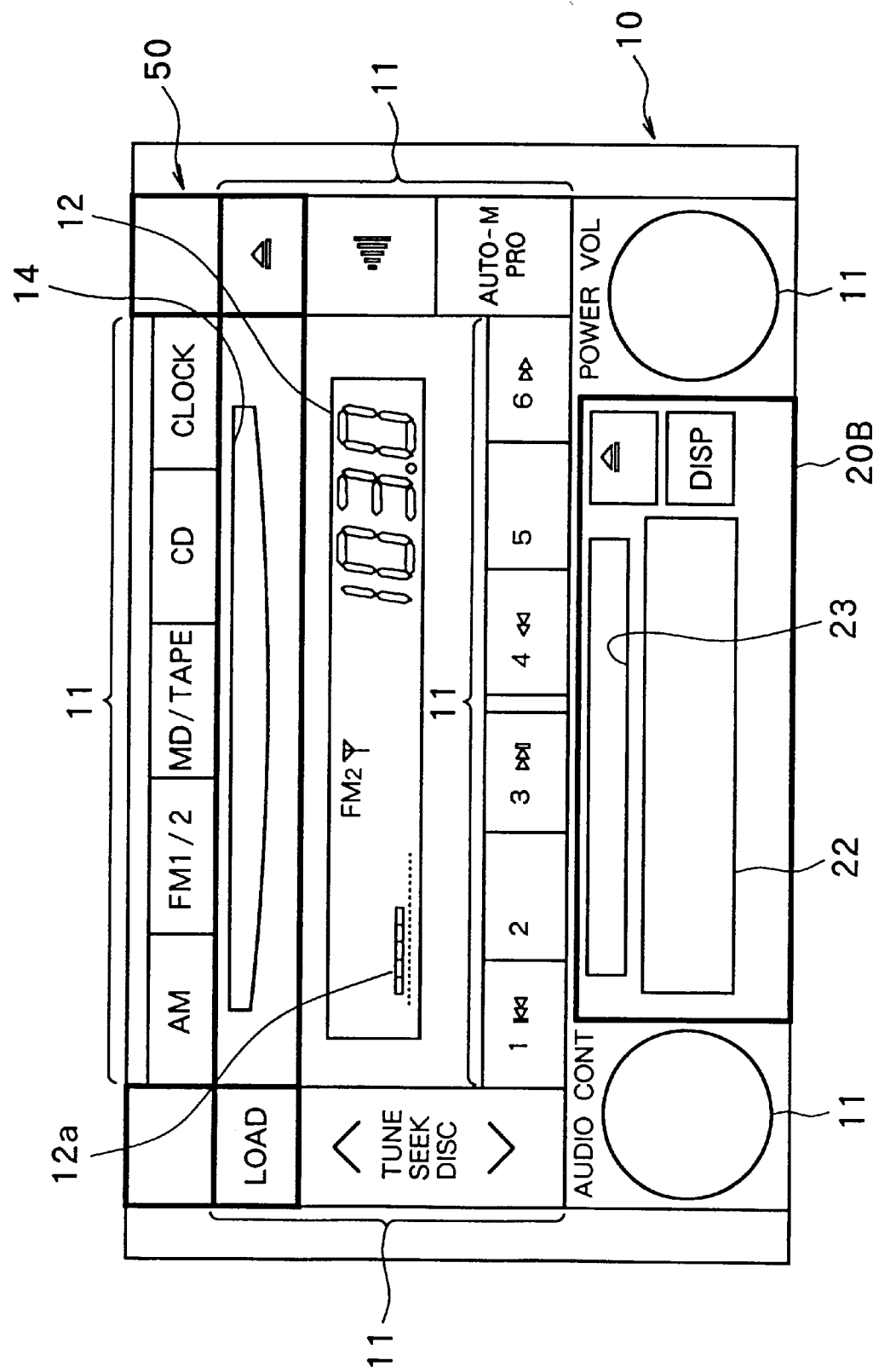
FIG. 2 is a front view of a control panel of the sound apparatus for a vehicle according to the embodiment of the present invention.

FIG. 1 is an exploded view of a sound apparatus for a vehicle of this embodiment. FIG. 2 is a front view of a control panel of the sound apparatus for a vehicle of this embodiment.

As shown in FIGS. 1 and 2, the sound apparatus for a vehicle of this embodiment comprises:

- a first sound playback unit 20 which reads out sound information from a storage medium such as a cassette tape, mini disk (MD), or the like that stores sound information of a predetermined information format, and plays it back as speech, music pieces, or the like;
- a second sound playback unit 30 for reading out and playing back information stored in a storage medium such as a compact disk (CD) or the like;
- a control unit 40 which systematically controls these first and second sound playback units 20 and 30, and has a general radio tuner function of AM and FM frequency ranges as one of sound playback functions; and
- a control panel 10 which allows a passenger of a vehicle to integrally operate the first and second sound playback units 20 and 30, and the control unit 40.

These units are arranged behind the control panel 10 which faces the interior of passenger room.

More specifically, the first sound playback unit 20 is a cassette tape player, an MD player, or a sound playback device having the same size as the former players. The unit 20 reads out sound information from a storage medium such as a cassette tape, MD, or the like that stores sound information in a predetermined information format, plays it back as a sound signal, and outputs the sound signal to the control unit 40 via a communication line (bus).

The second sound playback unit 30 reads out sound information stored in a storage medium having a size larger than that of the storage medium of the first sound playback unit 20, plays it back as a sound signal, and outputs the sound signal to the control unit 40 via a communication line (bus).

The second sound playback unit 30 includes a CD player, a CD player with a CD changer function that can store a plurality of CDs (also, an MD player with an MD changer function that can store a plurality of MDs), and the like.

Note that the first and second sound playback units 20 and 30 may have a function of writing information in a storage medium.

On one surface of the control panel 10 that faces the interior of the passenger room, as shown in FIG. 2, operation switches 11 that allow a passenger To operate the functions of a radio, CD, cassette tape, MD, and the like, a panel display device 12 such as an LCD for displaying operation modes of these functions, and a panel communication hole 14 used to load/unload the storage medium to/from the second sound playback unit 30 are laid out.

The panel display device 12 displays display data of the respective units, failure information, and information for assisting failure diagnosis (to be described later) using segments and characters.

A base chassis 1 which is detachably fixed to a vehicle body is detachably attached to the control panel 10, and the first and second sound playback units 20 and 30, and control unit 40 are detachably fixed to the base chassis 1 and are disposed on the other surface of the control panel 10.

Figure 3:
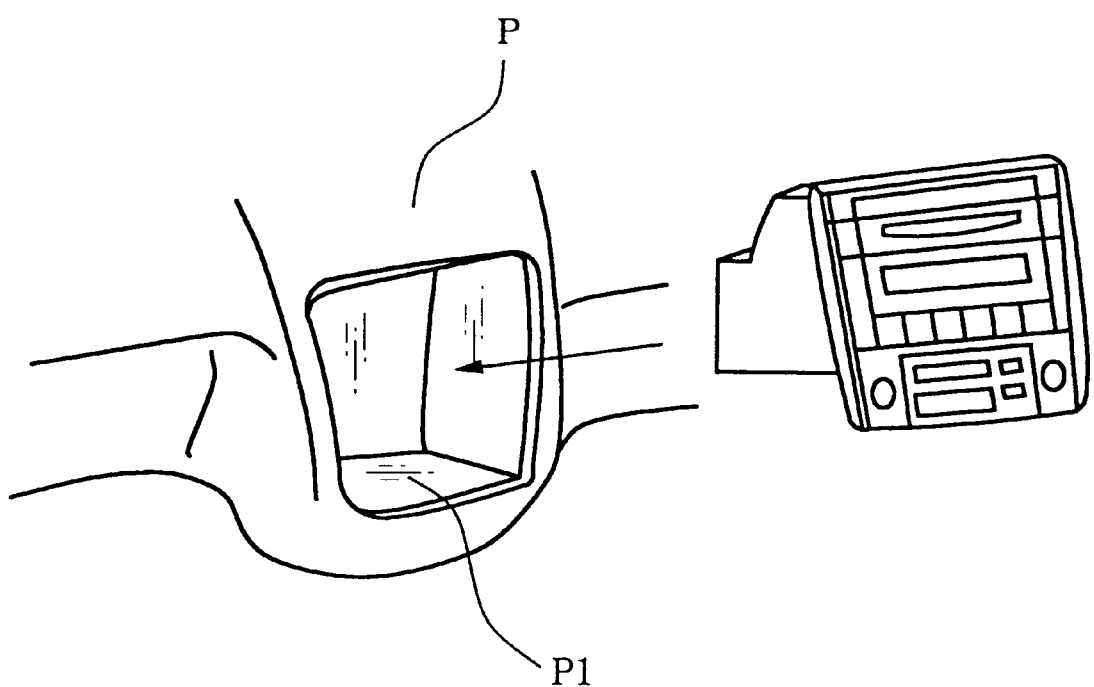
FIG. 3 is a perspective view showing the attachment structure of an electronic control unit for a vehicle in the passenger room in the embodiment of the present invention.

The base chassis 1 is detachably attached to an attachment recess portion P1 of an instrument panel P shown in FIG. 3.

The control unit 40 is detachably fixed to the base chassis 1, and selectively outputs control signals corresponding to input operations at various operation switches 11 on the control panel 10 to the first and second sound playback units 20 and 30 as needed.

The control unit 40 can communicate with the control panel 10 and the first and second sound playback units 20 and 30 via a communication line, and is disposed between, e.g., the first and second sound playback units 20 and 30 on the other surface side of the control panel 10 in this embodiment.

The first sound playback unit 20 is constructed by a housing portion 20A, and a passenger room-side panel portion 20B that projects from this housing portion 20A into the interior of the passenger room.

A pair of projections 15 are integrally formed on the control panel 10, and form a recess portion which surround the peripheral portions and a text display device 22 of the passenger room-side panel portion 20B of the first sound playback unit 20 when viewed from the interior of the passenger room, and make them face the interior of the passenger room. At least one of the pair of projections 15 has a tone volume switch for adjusting the tone volume in a sound function as one operation switch 11.

With this structure, the operation switches are provided on dead spaces present on two sides of the passenger room-side panel portion 20B of the first sound playback unit 20 to achieve space savings, and the first sound playback unit 20 can be flash with the control panel 10, thus improving the outer appearance.

FIG. 3 shows the attachment structure of the electronic control unit for a vehicle of this embodiment in the passenger room.

As shown in FIG. 3, the control panel 10, first and second sound playback units 20 and 30, and control unit 40 fixed using the base chassis 1 are attached to the attachment recess portion Pi between the driver's and passenger's seats in the instrument panel P which is located on the front side in the passenger room and has meters such as a speedometer and the like. The control panel 10 can systematically operate respective sound playback functions in place of operation switches in units of sound devices, which are adopted in a general car audio system.

FIG. 4 is a block diagram showing the electrical control functions of the sound apparatus for a vehicle according to this embodiment.

As shown in FIG. 4, the control panel 10 and control unit 40 are electrically connected via a communication line (bus) that connects between a connector 13 of the control panel 10, and a connector 43 of the control unit 40. An operation signal input by each operation switch is input to a CPU 46 which controls the operation of the control unit 40. The CPU 46 makes display control of the panel display device 12 of the control panel 10 using a control signal corresponding to the operation signal input by that operation switch 11.

The control unit 40 and second sound playback unit 30 are electrically connected via a communication line that connects between a connector 44 of the control unit 40, and a connector 31a of the second sound playback unit 30. An operation signal input by each operation switch is input to the CPU 46 of the control unit 40, and a control signal corresponding to that operation signal is output to the second sound playback unit 30. At this time, the CPU 46 controls display on the panel display device 12 in accordance with an operation mode of the second sound playback unit 30. The second sound playback unit 30 performs normal playback operation in the self unit in accordance with the input control signal, and a playback audio signal is output to the control unit 40.

The control unit 40 and first sound playback unit 20 are electrically connected via a communication line that connects between a connector 45 of the control unit 40 and a connector 21a of the first sound control unit 20. An operation signal input by each operation switch is input to the CPU 46 of the control unit 40, and a control signal corresponding to that operation signal is output to the first sound playback unit 20. At this time, the CPU 46 controls display on the panel display device 12 in accordance with an operation mode of the first sound playback unit 20. The first sound playback unit 20 performs normal playback operation in the self unit in accordance with the input control signal, and a playback audio signal is output to the control unit 40.

The CPU 46 of the control unit 40 controls a radio tuner 47 also having a general amplifier function in accordance with switch operation of the operation switches 11. Information that pertains to frequencies to be tuned by the radio tuner 47 are stored in a nonvolatile memory 48 (e.g., EEPROM) which does not require any power supply circuit for storing and holding information.

The CPU 46 selects one of an audio (sound) signal of the radio played back by the radio tuner, and audio signals which are played back by the first sound playback unit 20 and/or second sound playback unit 30 and are input to the control unit 40 via the communication lines. The selected signal is amplified by the amplifier function of the radio tuner 47 as needed, and is output to a plurality of loudspeakers 50 disposed at predetermined positions in the passenger room.

The first sound playback unit 20 is electrically and physically detachable from the control panel 10 directly or indirectly, and even when the first sound playback unit 20 is detached, the sound apparatus of this embodiment can achieve at least the control function of the second sound playback unit 30. As a result, even when the first sound playback unit 20 is attached as an option, the display area or time of display data associated with other units can be prevented from being limited unnecessarily.

As a characteristic feature of the sound apparatus for a vehicle according to this embodiment, the first and second sound playback units 20 and 30, and the radio tuner 47 in the control unit 40 make self diagnosis of predetermined diagnosis items at predetermined periods, and only failure information of those that represent diagnosis results is automatically stored in a nonvolatile memory 48 in the control unit 40 (details will be described later).

The CPU 46 reads out the stored failure information when that failure information is stored (i.e., when any failure has occurred) or in accordance with predetermined switch operation from the control panel 10, and displays display contents that represent the failure information on the panel display device 12 (details will be described later).

Note that a dedicated nonvolatile memory for storing failure information may be added. However, in this embodiment, the nonvolatile memory 48 that stores information which pertains to frequencies is also used as such memory, thus suppressing an increase in cost due to use of a plurality of nonvolatile memories which are normally more expensive than a memory that requires storage/holding operations.

On the other hand, when a security system, which prestores an arbitrary password in a nonvolatile memory in the control unit 40 and operates only when a password input by a passenger at the control panel at a predetermined timing (e.g., upon the first operation after the ignition key switch is turned on or upon turning on a main power supply of the sound apparatus for a vehicle) matches the stored password, is adopted to prevent the sound apparatus for a vehicle from being stolen, the nonvolatile memory for storing the password may store failure information so as to suppress an increase in cost.

As another characteristic feature of the sound apparatus for a vehicle according to this embodiment, the CPU 46 of the control unit 40 starts a failure diagnosis assist mode in accordance with switch operation of a given operation switch 11, and assists failure diagnosis of the control unit 40 for predetermined function items in the failure diagnosis assist mode (details will be described later).

Assume that display operation of failure information stored in the nonvolatile memory 48 and operation in the failure diagnosis assist mode are open to only a service person having expert knowledge in a service station such as a dealer or the like in this embodiment, but may also be described in the user's manual.

When the storage medium of the second sound playback unit 30 contains character information, that character information is displayed on the text display device 22 via the first sound playback unit 20. In this manner, display can be appropriately made even when the storage medium of the second sound playback unit 30 contains character information.

<Identification of Respective Units>

The aforementioned units are assigned device codes and product codes so as to allow the user to realize his or her desired system configuration and to allow the CPU 46 of the control unit 40 to identify that system configuration, in consideration of merchandizability of the sound apparatus.

That is, unique device codes (also referred to as unit codes in the following description or drawings) are assigned (e.g., "03" when a CD player is selected as the second sound playback unit 30, "07" when an MD player is selected, and so forth) so as to identify devices selected as the first and second sound playback units 20 and 30 and control unit 40 which construct the sound apparatus.

Also, the product codes (also referred to as manufacturer codes in the following description or drawings) allow to discriminate manufacturers or models of different specifications so as to realize a system configuration of user's choice even in given sound playback units, the device codes of which belong to an identical group, and which can play back a predetermined storage medium. More specifically, with this product code, for example, when a CD player with device code "03" is selected as the second sound playback unit 30 and a CD player of a manufacturer or model having standard performance is selected or a CD player of a high-performance model having a variety of optional functions or a manufacturer who manufactures that CD player is selected, the CPU 46 can recognize it.

In this embodiment, these device and product codes are output to the CPU 46 together with information (to be referred to as an error code hereinafter) indicating a failure when each unit has detected any failure in self diagnosis (to be described later) Upon receiving the device, product, and error codes, the CPU 46 stores these codes in the nonvolatile memory 48.

Note that storage time information (i.e., failure occurrence time) is preferably stored in the nonvolatile memory together with the failure information.

The device and product codes of the respective units which construct the sound apparatus for a vehicle may be pre-stored in the control unit 40 to make the CPU 46 recognize the system configuration, and these data may be exploited.

<Self Diagnosis Function and Failure Information Display Function in Each Unit>

Details of the self diagnosis functions and failure information display functions of the respective units that have been briefly explained in the paragraphs of the apparatus arrangement of the sound apparatus for a vehicle according to this embodiment will be explained below.

(Self Diagnosis Function)

FIG. 5 is a table for explaining the self diagnosis functions in respective units which can construct the sound apparatus for a vehicle according to this embodiment.

Vertical fields in FIG. 5 describe failure classes which pertain to the individual units, i.e., a control unit which can be selected as the control unit 40, a CD player (CD-P) unit and CD changer (CD-C) unit which can be selected as the second sound playback unit 30, and a cassette tape player (TAPE-P) unit and MD player (MD-P) unit which can be selected as the first sound playback unit, and also a class common to these units.

Also, horizontal fields in FIG. 5 describe items, for example, predetermined self diagnosis items to be diagnosed in the self units by the individual units at predetermined time periods, symptoms (events) to be detected as failures in these self diagnosis items, failure detection methods, and information indicating whether or not information indicating a detected failure (failure information) is stored in the nonvolatile memory 48 in the control unit 40.

As an item common to the respective units, predetermined self diagnosis of each unit is done at predetermined time periods, and upon detection of any failure, an error code that specifies the detected failure is output to the control unit 40 together with the aforementioned device and product codes. The CPU 46 of the control unit 40 stores these received codes in the nonvolatile memory 48.

In a preferred embodiment, even when each unit does not detect any failure, it must output a code indicating normal operation to the control unit 40 together with the device and product codes, so that the control unit 40 can recognize the operation state of the overall system. However, in this embodiment when the received code indicates a normal self diagnosis result, such code is not stored in consideration of the memory size of the nonvolatile memory 48.

The self diagnosis items of the individual units will be explained below. The diagnosis items shown in FIG. 5 are common independently of the manufacturer or model of, for example, a CD player selected. Since the self diagnosis items and their failure diagnosis methods themselves of the individual units shown in FIG. 5 are the state-of-the-art ones, a detailed description in this embodiment will be omitted.

Control Unit:

(1) PLL LOCK ERROR detection: detects if no radio signal is received (tuned) even after an elapse of a predetermined time in automatic tuning by the radio tuner 47;

(2) Abnormal power supply voltage detection: detects any power supply voltage drifts to an amplifier module (not shown) in the radio tuner 47; and (3) BUS LINE ERROR: detects failures of the communication lines to other units connected to the control unit by checking if no response signal is detected in response to an acknowledge signal sent to other units at predetermined time intervals.

CD Player Unit, CD Changer Unit, MD Player Unit:

(1) MECHANISM ERROR: detects if a storage medium (CD, MD) cannot be loaded or unloaded even after loading or unloading is repeated a predetermined number of times (the changer unit also detects that a storage medium to be read cannot be changed);

(2) SERVO ERROR: detects if track change is disabled upon reading the loaded CD disk; and (3) DISC READ ERROR: detects if a pickup cannot read the loaded CD disk.

Cassette Tape Player Unit:

(1) MECHANISM ERROR: detects if a tape cannot be loaded or unloaded even after loading or unloading is repeated a predetermined number of times;

(2) TIGHT TAPE ERROR: detects if no audio signal is played back as rotary members stopped during tape playback; and (3) TAPE CUT ERROR: detects if a tape is cut during feeding or playback of the tape.

(Failure Information Display Function)

The failure information display function will be explained below.

When the CPU 46 of the control unit 40 recognizes upon receiving the device, product, and error codes that any failure has occurred in a given self diagnosis item of the first and second sound playback units 20 and 30 or the control unit 40 itself described above with reference to FIG. 5, it stores these codes in the nonvolatile memory 48, as described above, and displays a predetermined pattern on the panel display device 12 for a predetermined period of time to inform in real time the passenger of the failure that has occurred.

The passenger often does not see such real-time display if he or she concentrates upon driving or the like. Hence, in this embodiment, when the control unit 40 detects that input operation for operating the disabled sound playback unit has been made at the control panel 10, or when the control unit 40 detects a predetermined control signal sent from the disabled sound playback unit in response to loading of a storage medium (CD or the like) into that sound playback unit, or the like, the control operation of the disabled sound playback unit is inhibited, or a predetermined process to be done in a normal state in response to the received control signal is inhibited.

In addition, a predetermined pattern for alarming the failure that has occurred is displayed again for a predetermined period of time.

The aforementioned display process and limitations on the operation control can be done since the nonvolatile memory 48 of the control unit 40 integrally stores failure information. In this manner, the failure state can be prevented from worsening by passenger's forcible operation, and the passenger can quickly select another available (operable) function without repeating wasteful operation, thus minimizing deterioration of operability upon failure.

In the two cases (upon failure and upon detection of a corresponding operation) mentioned above, since the failure information is displayed for the passenger on the panel display device 12, all codes stored in the nonvolatile memory 48 need not be displayed, and for example, "CHECK CD" or the like may be displayed when the CD player has failed.

When the panel display device 12 has a small display area, the aforementioned message may be divisionally displayed like "CHECK" and "CD", or characters of the message may run from the right end to the left end. Note that failure information (e.g., a power supply voltage error, PLL LOCK ERROR, or the like that has occurred in the control unit 40) which may confuse the passenger if it is displayed is not displayed.

The device, product, and error codes stored in the nonvolatile memory 48 are read out from the memory in response to predetermined first operation input at the control panel 10, and are displayed on the panel display device 12.

Upon display, these codes are displayed on the panel display device 12 in turn from, e.g., the latest ones every time predetermined key operation (ninth operation in the control process to be described later; for example, operation of a frequency seek key or the like) is made, in consideration of the display area size of the panel display device 12.

Since these codes are displayed for a service person in a service station, they may be displayed simultaneously like "05 03: Er30" or divisionally.

With these codes, the service person can quickly recognize the state of failure that occurred. Note that the predetermined first operation may be set as a combination of the order, continuous depression times, and the like of operations of a plurality of switches provided to the control panel 10.

In this embodiment, the product code is also displayed in response to the predetermined first operation. For this reason, the system configuration of the sound apparatus for a vehicle, which differs depending on users, can be recognized quickly upon maintenance in a service station.

<Failure Diagnosis Assist Function>

Details of the failure diagnosis assist function (failure diagnosis assist mode) that has been briefly explained in the paragraphs of the apparatus arrangement of the sound apparatus for a vehicle according to this embodiment will be explained below.

This function aims at assisting failure diagnosis made by a service person having expert knowledge in a service station.

This function is implemented when the control unit 40 executes operation in response to predetermined second operation (second to eighth operations in the control process to be described later; having a combination pattern different from the first operation) which is set in advance as a combination of the order, continuous depression times, and the like of operations of a plurality of switches provided to the control panel 10.

According to the failure diagnosis assist function, the service person can easily check any failure according to visible or audible assists without using any special inspection apparatus.

FIG. 6 is a table for explaining the failure diagnosis assist functions that can be executed by the sound apparatus for a vehicle according to this embodiment. Horizontal fields in FIG. 6 describe items, for example, diagnosis items of the service person, symptoms of failures to be detected, failure diagnosis methods (operations) to be done by the control unit 40 as assist operations, and the presence/absence of storage of information in the nonvolatile memory 48. The diagnosis items will be described below.

LCD Display:

All display elements of the panel display device 12 are activated so that the service person can visually confirm the operation state of the panel display device 12.

Function Key:

When an operation signal of any switch is input to the control unit 40, beep tone or the like is generated via the loudspeaker 50 so that the service person can audibly confirm whether or not operations of a plurality of switches provided to the control panel 10 are normally recognized.

Loudspeaker Connection:

Beep tone or the like is generated in turn via each loudspeaker so that the service person can audibly confirm any connection error or disconnection of lines to the plurality of loudspeakers 50.

Radio Tuner:

The S-METER voltage of the radio tuner 47 is displayed as the length of a bar, i.e., the number of display elements 12a in the panel display device 12, so that the service person can visually confirm the state of an RF input voltage of the radio tuner 47.

Diversity Function:

The service person can manually switch the switching function of main and sub antennas (not shown) connected to the radio tuner 47 by predetermined second operation. In this case, the service person checks the reception performance difference from performance upon operation of the diversity function based on an audio state output from the loudspeakers 50.

Antenna Control Function:

The antenna control output is displayed as a numerical value or bar on the panel display device 12, so that the service person can visually confirm if an antenna (not shown) connected to the radio tuner 47 is automatically extended/contracted.

Amplifier Control Function

In this embodiment, the antenna control output is displayed as a numerical value or bar on the panel display device 12 so that the service person can visually confirm the operation state of the amplifier module provided in the radio tuner 47.

The aforementioned diagnosis items are merely examples, and the present invention is not limited to these items. In these cases, no information is stored in the nonvolatile memory 48. This is because information need not be stored in the nonvolatile memory 48 since the operations of the failure diagnosis assist functions are done by the service person in a non-steady operation state, and decisions can be made at that time. In addition, this is to prevent failure information already stored in the memory by the self diagnosis function from being deleted, and to suppress the number of write times in an EEPROM which has a limited number of write/erase times.

The control processes of the control unit 40 and first and second sound playback units 20 and 30, which implement the aforementioned operations, will be explained below.

<Control Process of Control Unit 40>

FIGS. 7A and 7B, and FIGS. 8A and 8B are flow charts showing the control process of the control unit 40 in this embodiment, and show the sequence of the control program that the CPU 46 begins to execute upon turning on the power switch on the control panel 10.

Figure 7A:
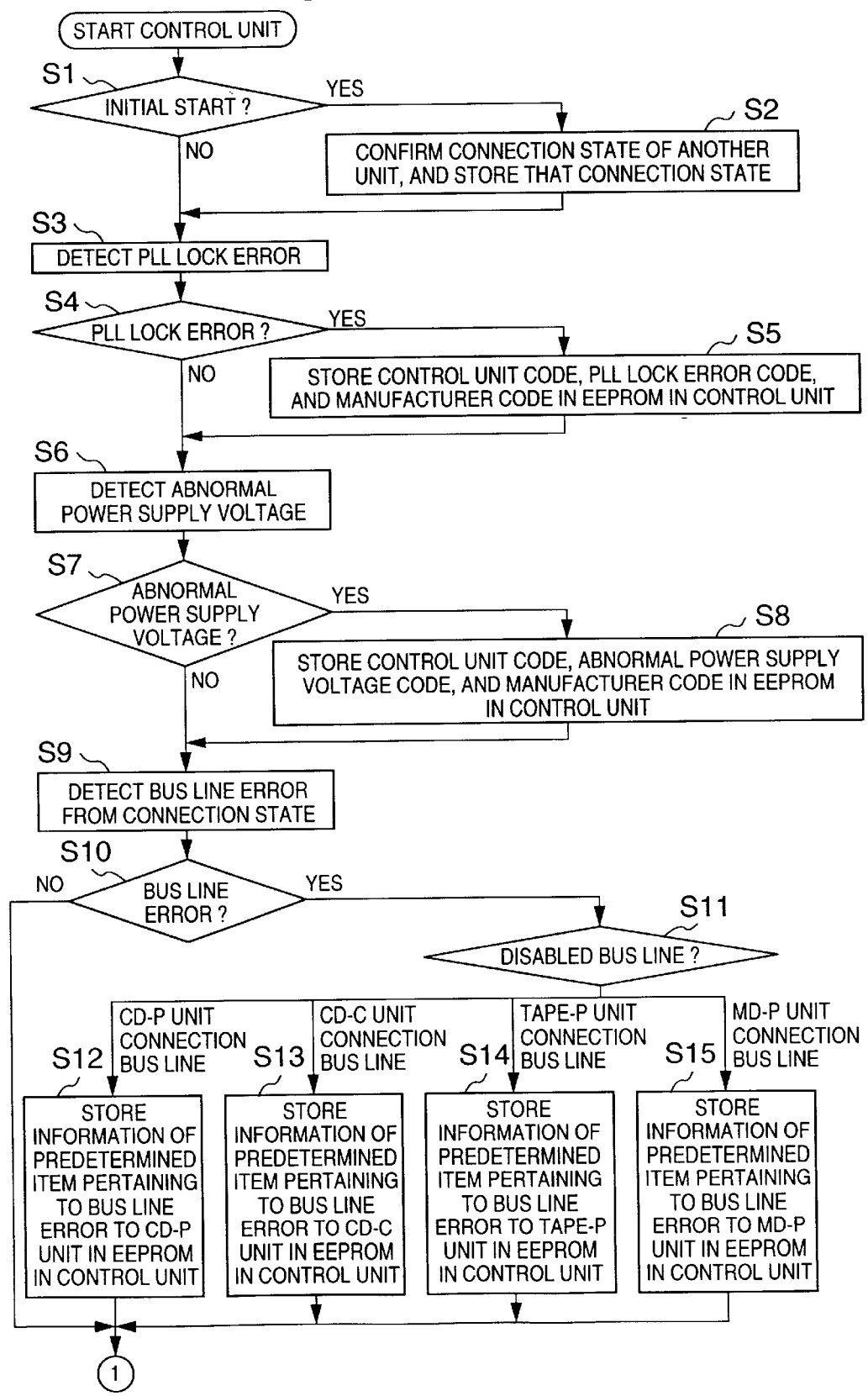
FIGS. 7A and 7B are flow charts showing the control process of a control unit 40 in the embodiment of the present invention.
Figure 7B:
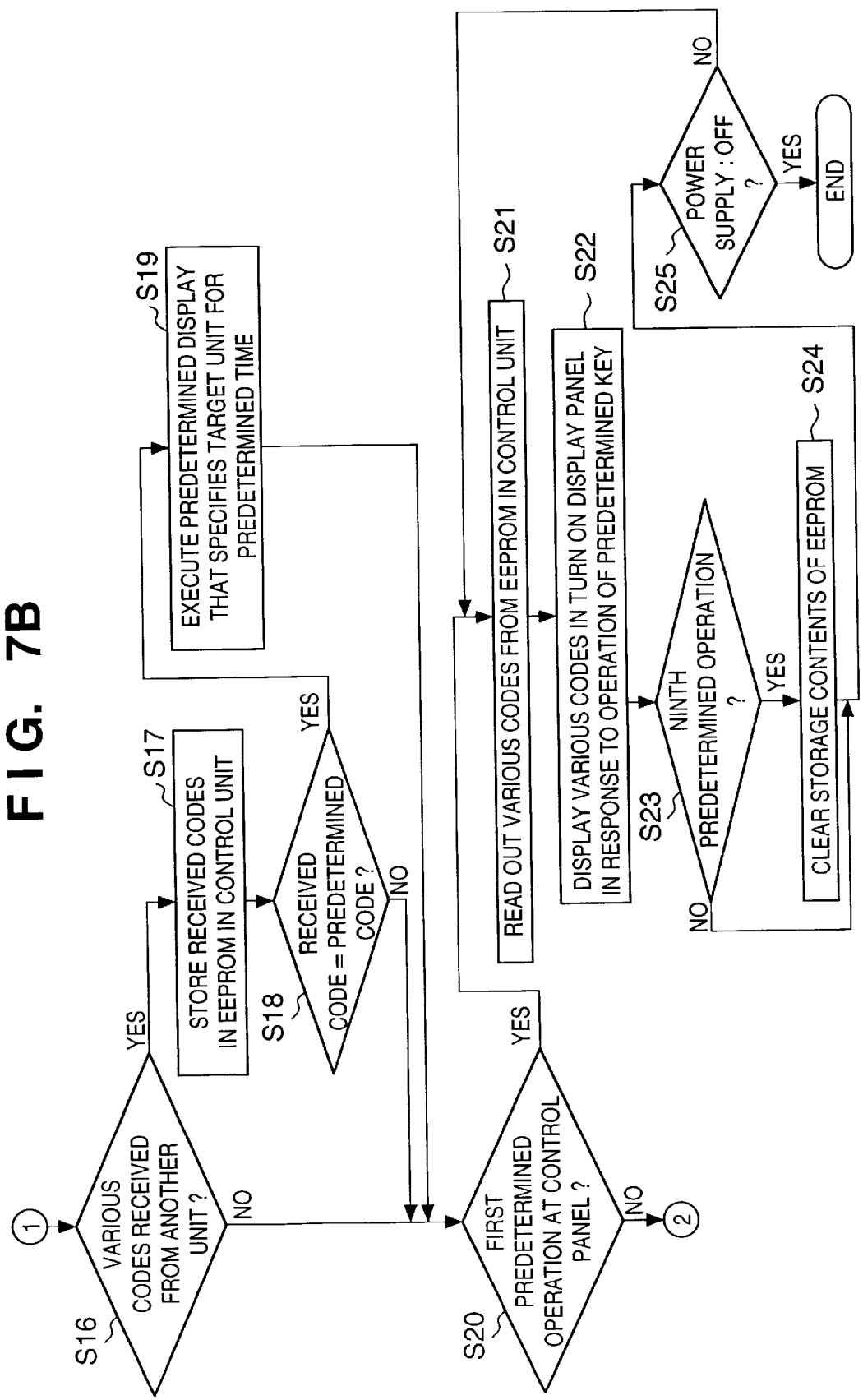

Steps S1 to S25 shown in FIGS. 7A and 7B are processes for implementing the aforementioned failure information display function.

Steps S1 and S2: It is checked if the current control period is the first process (initial start) after power ON. If NO in step S1 (the current control period is not initial start), the flow advances to step S3; if YES in step S1 (the current control period is initial start), the connection states of other units connected to the control unit 40 are detected, the detection result is stored in a RAM (not shown) or the like (step S2), and the flow advances to step S3. In step S2, if no response signal is detected in response to an acknowledge signal sent to a given unit at predetermined time periods, it is determined that the unit is not connected to the control unit 40, and information indicating that connection state can be stored.

Step S3: The aforementioned PLL LOCK ERROR detection is executed.

Steps S4 and 5: It is checked if a PLL LOCK ERROR has occurred (step S4). If NO in step S4 (no such error has occurred), the flow advances to step S6; if YES in step S4 (the error has occurred), the device and product codes of the control unit 40 and an error code indicating the PLL LOCK ERROR are stored in the nonvolatile memory 48 (step S5), and the flow advances to step S6.

Step S6: The aforementioned abnormal power supply voltage detection is executed.

Steps S7 and S8: It is checked if an abnormal power supply voltage has been generated (step S7). If NO in step S7 (no such error has occurred), the flow advances to step S9; if YES in step S7 (that error has occurred), device and product codes of the control unit 40 and an error code indicating the abnormal power supply voltage are stored in the nonvolatile memory 48 (step S8), and the flow advances to step S9.

Step S9: The aforementioned bus line error detection is executed.

Steps S10 and S11: It is checked if a bus line error has occurred (step S10) If NO in step S10 (no such error has occurred), the flow jumps to step S16.

If YES in step S10 (that error has occurred), in step S11 the flow branches:

to step S12 if an error has occurred in the communication line to the CD player, to step S13 if an error has occurred in the communication line to the player with the CD changer function, to step S14 if an error has occurred in the communication line to the tape player, or to step S15 if an error has occurred in the communication line to the MD player, in correspondence with a communication line that has suffered the bus line error.

Steps S16 and S17: It is checked if various codes (device, product, and error codes) have been received from another unit via the communication line (step S16) If NO in step S16 (no such codes have been received), the flow advances to step S20; if YES in step S16 (the codes have been received), these received codes are stored in the nonvolatile memory 48 (step S17), and the flow advances to step S18.

Steps S18 and S19: It is checked if the error code stored in step S17 is a predetermined code for which an error message is to be displayed using the predetermined display pattern ("CHECK CD", or the like) on the panel display device 12 (step S18). If NO in step S18 (the stored code is not a predetermined code), the flow advances to step S20; if YES in step S18 (the stored code is a predetermined code), the predetermined display pattern corresponding to that error code is displayed on the panel display device 12 (step S19), and the flow advances to step S20.

Steps S20 to S22: It is checked if predetermined first operation has been input at the control panel 10 (step S20). If NO in step S20 (no input is made), the flow jumps to step S31; if YES in step S20 (the input is detected), the device, product, and error codes stored in the nonvolatile memory 48 are read out onto a RAM (not shown) or the like (step S21), and are displayed in turn on the panel display device 12 in response to predetermined key operation (e.g., operation of a frequency seek key or the like) (step S22).

Steps S23 and S24: It is checked if predetermined ninth operation has been input at the control panel 10 (step S23). If NO in step S23 (no such input is detected), the flow jumps to step S25; if YES in step S23 (the input is detected), the device, product, and error codes stored in the nonvolatile memory 48 are cleared (step S24), and the flow advances to step S24.

Step S25: It is checked if the power switch is turned off at the control panel 10. If NO in step S25 (the power switch is ON), the flow returns to step S21; if YES in step S25 (the power switch=OFF is detected), the process ends.

Figure 8A:
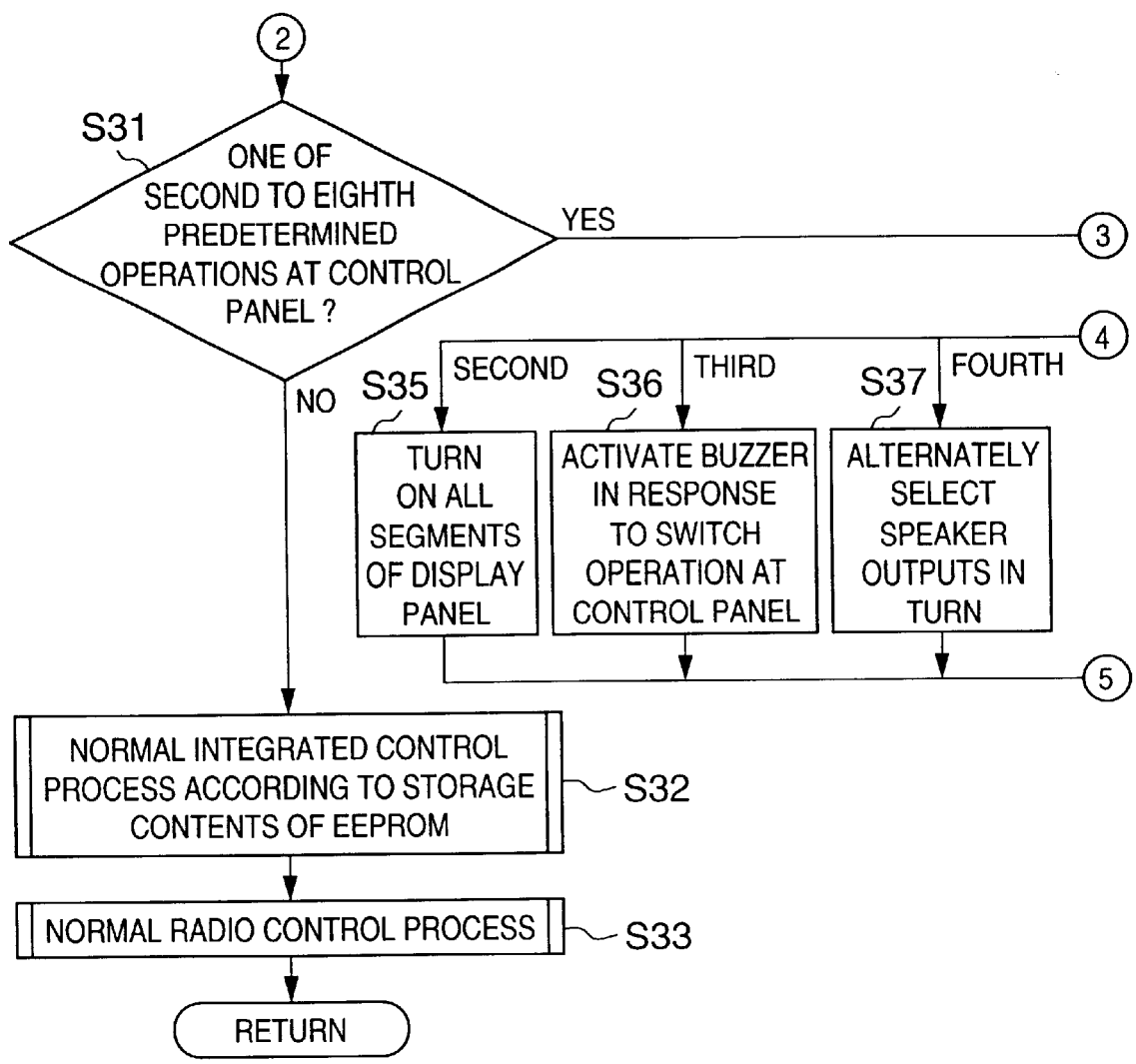
FIGS. 8A and 8B are flow charts showing the control process of the control unit 40 in the embodiment of the present invention.
Figure 8B:
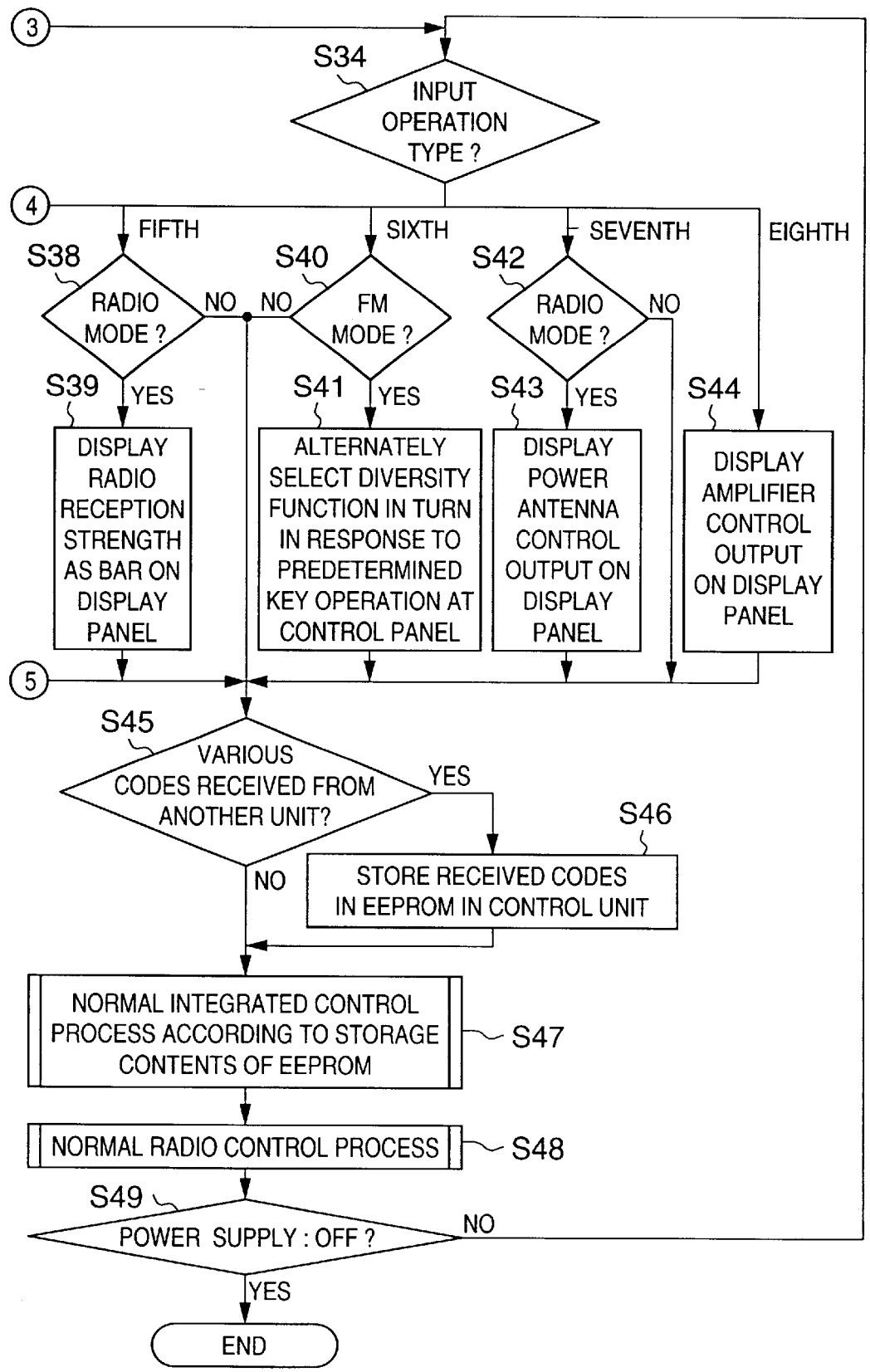

Steps S31 to S49 shown in FIGS. 8A and 8B are processes for implementing the aforementioned self diagnosis assist functions.

Steps S31 to S44: It is checked if one of predetermined second to eighth operations has been input at the control panel 10 (steps S31 and S32). The flow branches to one of steps S35 to S44 in accordance with the checking results in these steps, and the aforementioned operations such as LCD display and the like are made as the self diagnosis assist functions in the individual steps.

Steps S45 and S46: It is checked if various codes (device, product, and error codes) have been received from another unit via the communication line (step S45). If NO in step S45 (no such codes have been received), the flow advances to step S47; if YES in step S45 (the codes have been received), these received codes are stored in the nonvolatile memory 48 (step S46), and the flow advances to step S47.

Step S32: The device, product, and error codes stored in the nonvolatile memory 48 are looked up, and if input operation for operating the disabled unit has been made at the control panel 10, a message ("CHECK CD" or the like) for informing the passenger of a failure is displayed.

On the other hand, if input operation for operating a normal unit has been made at the control panel 10, or if none of units have failed, a control signal corresponding to that operation is input to that unit, thus making normal operation for outputting an audio signal or the like from the loudspeakers 50.

Step S33: The radio tuner 47 is controlled to operate as a normal radio tuner.

Step S47: The device, product, and error codes stored in the nonvolatile memory 48 are looked up, and if input operation for operating the disabled unit has been made at the control panel 10, a message ("CHECK CD" or the like) for informing the passenger of a failure is displayed.

On the other hand, if input operation for operating a normal unit has been made at the control panel 10, or if none of units have failed, a control signal corresponding to that operation is input to that unit, thus making normal operation for outputting an audio signal or the like from the loudspeakers 50.

Step S48: The radio tuner 47 is controlled to operate as a normal radio tuner.

Step S49: It is checked if the power switch is turned off at the control panel 10. If NO in step S49 (the power switch is ON), the flow returns to step S34; if YES in step S49 (the power switch=OFF is detected), the process ends. Therefore, in this embodiment once the failure diagnosis assist mode has started, normal operation cannot be resumed until the power switch is turned off.

<Control Processes of First and Second Sound Playback Units 20 and 30>

The control processes done by the CPUs of the CD player unit, player unit with the CD changer function, cassette tape player unit, and MD player unit which can be selected as the first and second sound playback units 20 and 30 will be explained below.

FIG. 9 is a flow chart showing the control process of the CD player unit and exemplifies the processing sequence for implementing normal operation of the CD player and the self diagnosis function of the CD player unit described above with reference to FIG. 5.

Steps S101 to S103 (FIG. 9) A mechanism error detection process of the CD player unit is executed, and it is checked if any error has occurred as a result of the process (steps S101 and S102). If NO in step S102, the flow jumps to step S104; if YES in step S102, the device and product codes of the CD player unit are sent to the control unit 40 together with an error code indicating the mechanism error (step S103), and the flow advances to step S104.

Steps S104 to S106: The same processes as those for the mechanism error are executed for a servo error Steps S107 to S109: The same processes as those for the mechanism error are executed for a read error.

Step S110: Normal operation control (playback, stop, fast forwarding, or the like) as the normal CD player unit is executed in accordance with a control signal received from the control unit 40, and the flow returns.

Figure 10:
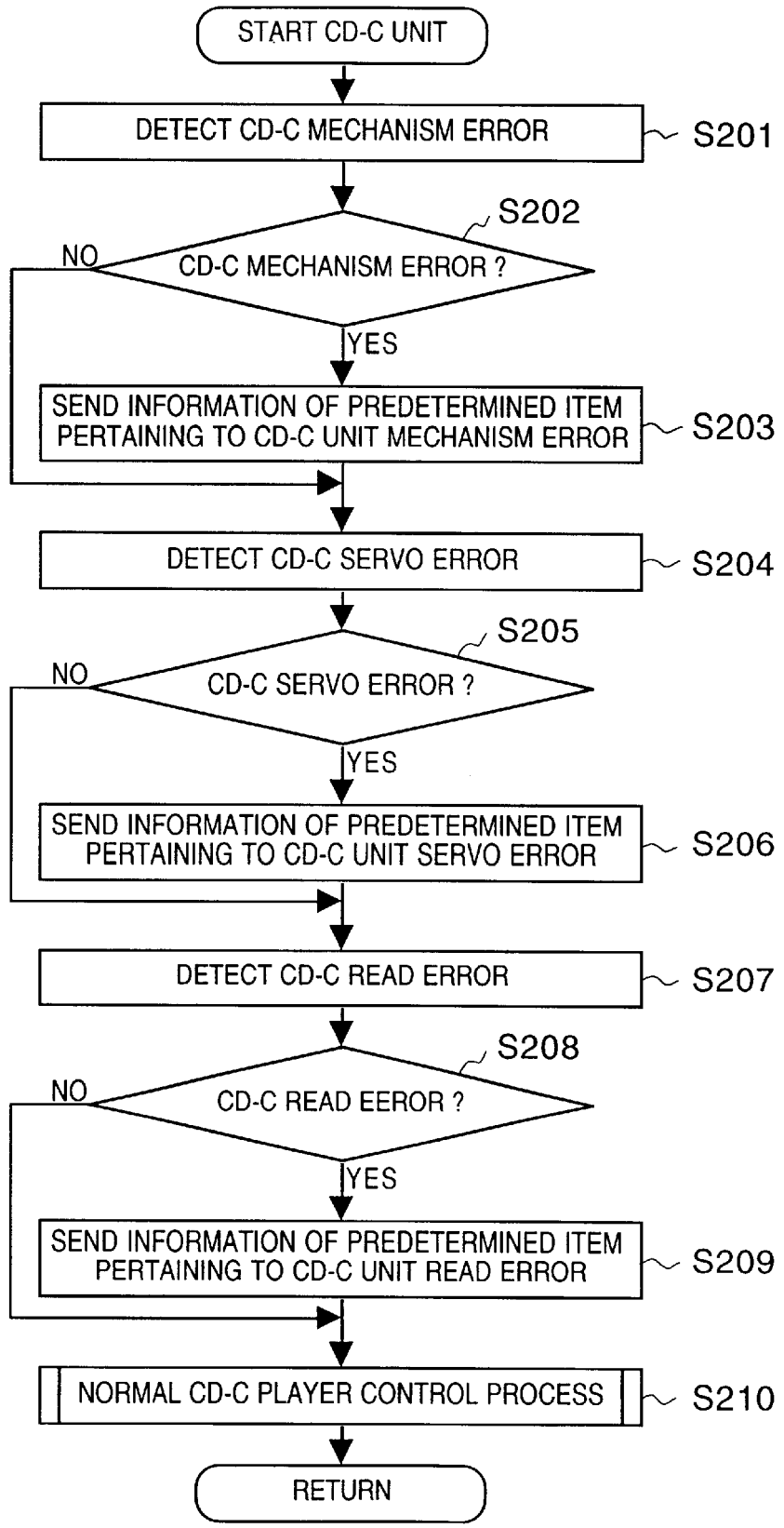
FIG. 10 is a flow chart showing the control process of a player unit with a CD changer function.

FIG. 10 is a flow chart showing the control process of the player unit with the CD changer function. As has been explained above with reference to FIG. 5, since the process configuration of this unit is substantially the same as the control process of the CD player shown in FIG. 9, a repetitive description will be avoided. As an item to be detected in step S201 as a mechanism error, whether or not a disk to be read can be changed is detected, and a change of a disk to be read is added to the operation control in step S210.

Figure 11:
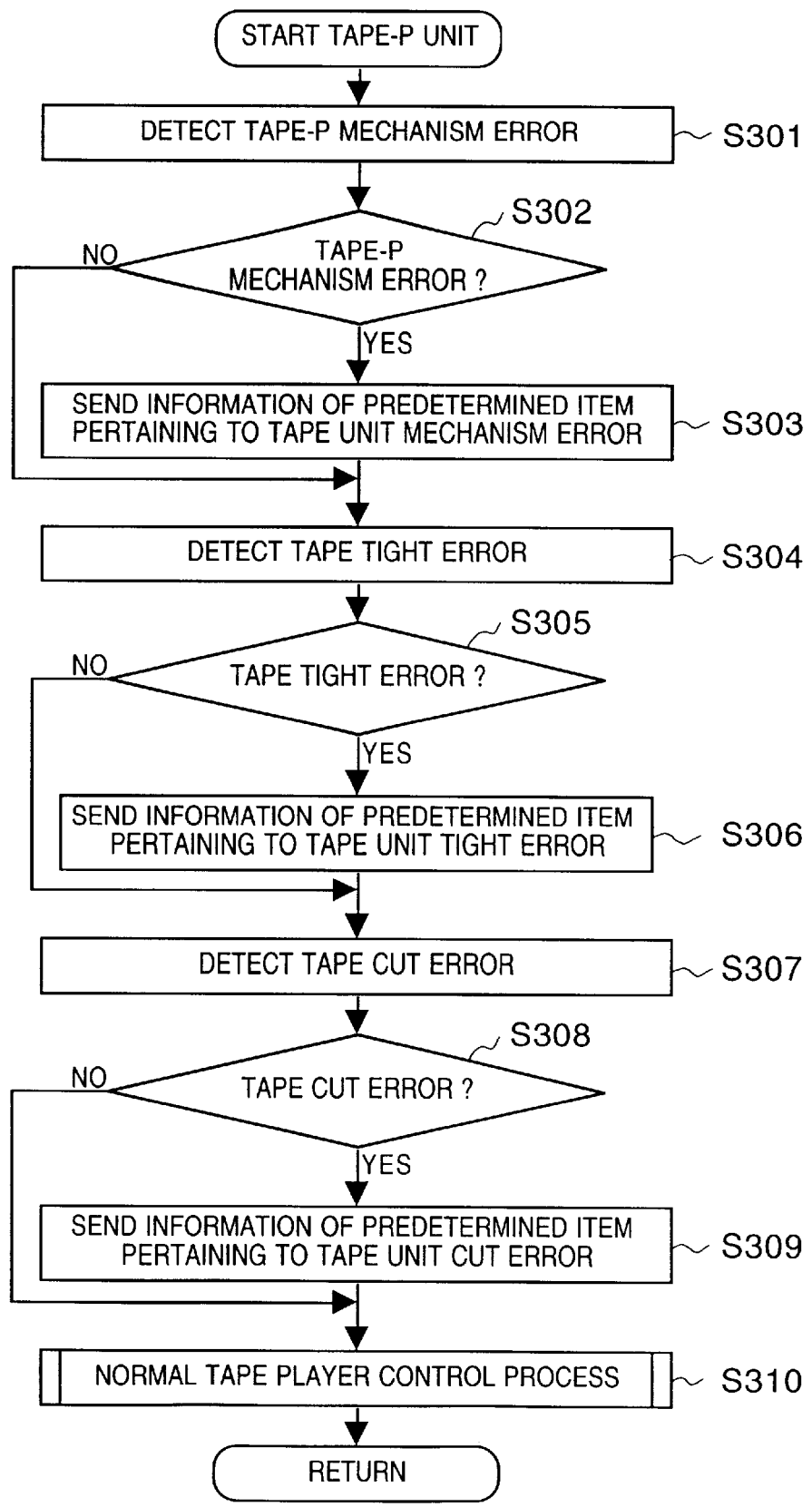
FIG. 11 is a flow chart showing the control process of a cassette tape player unit.

FIG. 11 is a flow chart showing the control sequence of the cassette tape player, and the process configuration of this unit is substantially the same as the control process of the CD player unit shown in FIG. 9. As decision items in respective steps, a tape tight error and tape cut error are detected, as has been explained above with reference to FIG. 5.

Figure 12:
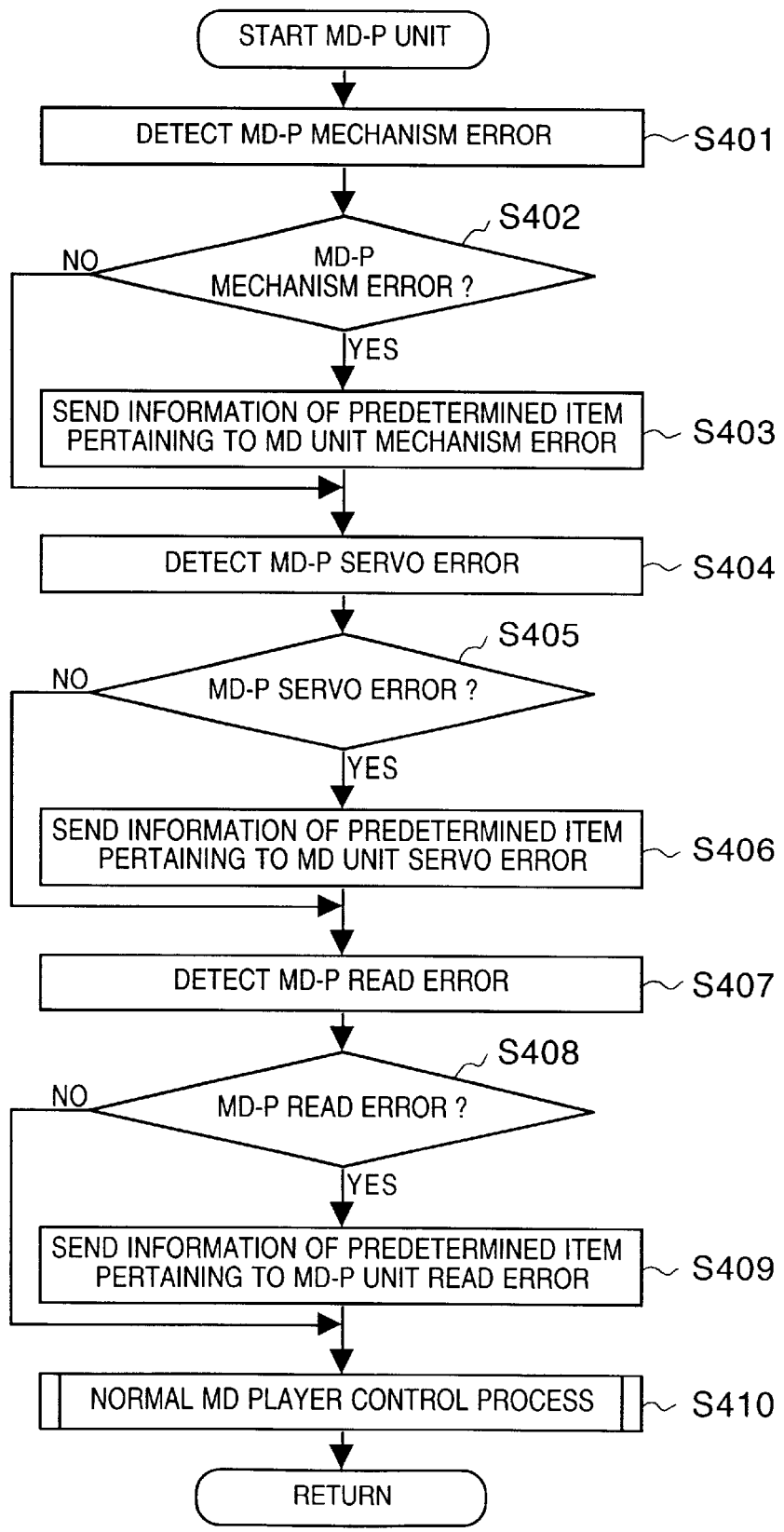
FIG. 12 is a flow chart showing the control process of an MD player unit.

FIG. 12 is a flow chart showing the control process of the MD player unit. As has been explained above with reference to FIG. 5, since the process configuration of this unit is substantially the same as the control process of the CD player unit shown in FIG. 9, except that a storage medium to be read is an MD, a repetitive description will be omitted.

In the above embodiment, the sound apparatus which can select two sound playback units, i.e., the first and second sound playback units 20 and 30 has been exemplified. However, the present invention is not limited to such specific arrangement, but may be applied to a system which can select three or more units or a system which can select only one unit.

In the above embodiment, the control unit 40 comprises the-radio tuner 47 as one of sound playback units. However, the present invention is not limited to such specific arrangement, but may be applied to a system arrangement which can select a radio tuner function as one sound playback unit or a system arrangement which has another sound playback function (e.g., a cassette tape playback function) in the control unit 40.

In the above embodiment, the communication lines among the individual units are connected to have the CPU 46 of the control unit 40 as the center. However, the present invention is not limited to such specific arrangement, but may be applied to a so-called intra-vehicle LAN as a communication line pattern.

As described above, according to this embodiment, information of failures that have occurred in various sound playback units which construct the sound apparatus for a vehicle can be integrally stored.

As many apparently widely different embodiments of the present invention can be made without departing from the spirit and scope thereof, it is to be understood that the invention is not limited to the specific embodiments thereof except as defined in the appended claims.

What is claimed is:

1. A sound apparatus for a vehicle, which comprises:

a display device;

a sound playback unit playing back sound information in a predetermined information format, making a self diagnosis of predetermined items therein, and outputting a diagnosis result indicative thereof to a control unit via a communication line; and a control panel comprising operation switches to operate the display device and the sound playback unit;

a control unit controlling an operation of said sound playback unit in accordance with an operation signal input from one of the operation switches, wherein said sound playback unit and said control unit are independent from said control panel, and said control unit makes a self diagnosis of predetermined items therein and outputs a diagnosis result indicative thereof, and stores failure information of the diagnosis result thereof and the diagnosis result from said sound playback unit in a nonvolatile memory provided thereto.

2. The apparatus according to claim 1, wherein said control unit also controls display operation of said display device, and displays failure information stored in said nonvolatile memory on said display device in accordance with a predetermined operation input at said control panel.

3. The apparatus according to claim 2, wherein said sound apparatus for a vehicle can mount as said sound playback unit an arbitrary sound playback unit selected from a plurality of different sound playback units of different manufacturers or models, and said control unit displays identification information which can specify a manufacturer or model of the sound playback unit which is selected in advance and mounted as said sound playback unit in association with the failure information when the failure information is displayed on said display device in response to the predetermined operation input at said control panel.

4. The apparatus according to claim 1, wherein said sound apparatus for a vehicle can mount as said sound playback unit an arbitrary sound playback unit selected from a plurality of different sound playback units of different manufacturers or models, said sound playback unit outputs identification information that can specify a manufacturer or model of the sound playback unit together with the diagnosis result upon outputting the diagnosis result to said control unit, and said control unit stores the failure information and identification information in said nonvolatile memory, also controls display operation of said display device, and displays the failure information and identification information in association with each other in response to a predetermined operation input at said control panel.

5. The apparatus according to claim 1, wherein said sound playback unit includes a plurality of sound playback units for playing back storage media of different formats, and when a failure has occurred in one of communication lines to the plurality of sound playback units as one of the predetermined self diagnosis items, said control unit stores information that can specify the communication line which has suffered the failure in said nonvolatile memory.

6. The apparatus according to claim 5, wherein said control unit inhibits failure diagnosis of the communication lines until predetermined initial start operation thereof is completed.

7. The apparatus according to claim 1, wherein, when input operation for operating the disabled sound playback unit corresponding to the failure information stored in said nonvolatile memory is made at said control panel, said control unit displays on said display device information indicating that the sound playback unit has failed.

8. The apparatus according to claim 1, wherein said nonvolatile memory uses a nonvolatile memory for storing a password which can restrict unauthorized access to said sound apparatus for a vehicle.

9. The apparatus according to claim 1, wherein, when operation for operating the disabled sound playback unit corresponding to the failure information stored in said nonvolatile memory is input at said control panel, said control unit inhibits operation control of that disabled sound playback unit.

10. The apparatus according to claim 1, wherein, when a control signal is received from said sound playback unit, said control unit executes a predetermined process according to the control signal, and when the control signal is received from the disabled sound playback unit corresponding to the failure information stored in said nonvolatile memory, said control unit inhibits execution of the predetermined process for the disabled sound playback unit.

11. The apparatus according to claim 7, wherein, when a control signal is received from said sound playback unit, said control unit executes a predetermined process according to the control signal, and when the control signal is received from the disabled sound playback unit corresponding to the failure information stored in said nonvolatile memory, said control unit inhibits execution of the predetermined process for the disabled sound playback unit.

12. A sound apparatus for a vehicle, which comprises: a control panel provided with operation switches that can operate a display device and a sound playback unit on one surface facing a passenger room;

a sound playback unit which is disposed as one component on the other surface of said control panel and plays back sound information pre-stored in a storage medium, makes self diagnosis of predetermined items therein, and outputs a diagnosis result indicative thereof to a control unit via a communication line; and a control unit which is disposed as one component on the other surface of said control panel, has a radio tuner as another sound playback unit, and controls playback operations of said radio tuner and said sound playback unit in accordance with an operation signal input from the operation switch, wherein said control unit makes self diagnosis of predetermined items including operation of said radio tuner therein and outputs a diagnosis result indicative thereof, and stores failure information of the diagnosis result thereof and the diagnosis result input from said sound playback unit in a nonvolatile memory provided thereto.

13. The apparatus according to claim 12, wherein said nonvolatile memory uses a nonvolatile memory for storing frequency information to be received by said radio tuner.

14. The apparatus according to claim 12, wherein said control unit also controls display operation of said display device, and displays failure information stored in said nonvolatile memory on said display device in accordance with a predetermined operation input at said control panel.

15. The apparatus according to claim 14, wherein said sound apparatus for a vehicle can mount as said sound playback unit an arbitrary sound playback unit selected from a plurality of different sound playback units of different manufacturers or models, and said control unit displays identification information which can specify a manufacturer or model of the sound playback unit which is selected in advance and mounted as said sound playback unit in association with the failure information when the failure information is displayed on said display device in response to the predetermined operation input at said control panel.

16. The apparatus according to claim 12, wherein said sound apparatus for a vehicle can mount as said sound playback unit an arbitrary sound playback unit selected from a plurality of different sound playback units of different manufacturers or models, said sound playback unit outputs identification information that can specify a manufacturer or model of the sound playback unit together with the diagnosis result upon outputting the diagnosis result to said control unit, and said control unit stores the failure information and identification information in said nonvolatile memory, also controls display operation of said display device, and displays the failure information and identification information in association with each other in response to a predetermined operation input at said control panel.

17. The apparatus according to claim 12, wherein said sound playback unit includes a plurality of sound playback units for playing back storage media of different formats, and when a failure has occurred in one of communication lines to the plurality of sound playback units as one of the predetermined self diagnosis items, said control unit stores information that can specify the communication line which has suffered the failure in said nonvolatile memory.

18. The apparatus according to claim 17, wherein said control unit inhibits failure diagnosis of the communication lines until predetermined initial start operation thereof is completed.

19. The apparatus according to claim 12, wherein, when input operation for operating the disabled sound playback unit corresponding to the failure information stored in said nonvolatile memory is made at said control panel, said control unit displays on said display device information indicating that the sound playback unit has failed.

20. The apparatus according to claim 12, wherein said nonvolatile memory uses a nonvolatile memory for storing a password which can restrict unauthorized access to said sound apparatus for a vehicle.

21. The apparatus according to claim 12, wherein, when operation for operating the disabled sound playback unit corresponding to the failure information stored in said nonvolatile memory is input at said control panel, said control unit inhibits operation control of that disabled sound playback unit.

22. The apparatus according to claim 12, wherein, when a control signal is received from said sound playback unit, said control unit executes a predetermined process according to the control signal, and when the control signal is received from the disabled sound playback unit corresponding to the failure information stored in said nonvolatile memory, said control unit inhibits execution of the predetermined process for the disabled sound playback unit.

23. The apparatus according to claim 19, wherein, when a control signal is received from said sound playback unit, said control unit executes a predetermined process according to the control signal, and when the control signal is received from the disabled sound playback unit corresponding to the failure information stored in said nonvolatile memory, said control unit inhibits execution of the predetermined process for the disabled sound playback unit.

* * * * *

UNITED STATES PATENT AND TRADEMARK OFFICE
CERTIFICATE OF CORRECTION

PATENT NO. : 6,628,573 B2
DATED : September 30, 2003
INVENTOR(S) : Tsutomu Hasegawa et al.

It is certified that error appears in the above-identified patent and that said Letters Patent is hereby corrected as shown below:

Drawings,
FIG. 5, change "DESABLED" to -- DISABLED -- (3 occurrences).

Column 1,
Line 57, change "unit" to -- units --.

Column 5,
Line 49, after "of" insert -- the --.

Column 6,
Line 6, change "To" to -- to --;
Line 37, change "are" to -- is --;
Line 38, change "surround" to -- surrounds --;
Line 58, change "Pi" to -- P1 --.

Column 7,
Line 39, change "operation" to -- operations --.

Column 9,
Line 12, after "later)" insert -- . --.

Column 11,
Line 5, change "passenger's" to -- passenger --.

Column 13,
Line 42, after "S10" insert -- . --.
Line 58, after "S16)" insert -- . --.

UNITED STATES PATENT AND TRADEMARK OFFICE
CERTIFICATE OF CORRECTION

PATENT NO.    : 6,628,573 B2
DATED         : September 30, 2003
INVENTOR(S)   : Tsutomu Hasegawa et al.

It is certified that error appears in the above-identified patent and that said Letters Patent is hereby corrected as shown below:

Column 15,
Line 20, after "(Fig. 9)" insert -- : --.
Line 29, after "error" insert -- ; --.
Line 29, begin a new paragraph with "Steps S107";
Line 67, delete "-".

Signed and Sealed this

Thirtieth Day of March, 2004

JON W. DUDAS
*Acting Director of the United States Patent and Trademark Office*